United States Patent [19]

Ahmed

[11] 3,921,013

[45] Nov. 18, 1975

[54] BIASING CURRENT ATTENUATOR

[75] Inventor: Adel Abdel Aziz Ahmed, Annandale, N.J.

[73] Assignee: RCA Corporation, New York, N.Y.

[22] Filed: Apr. 24, 1974

[21] Appl. No.: 463,605

[30] Foreign Application Priority Data

May 30, 1973 United Kingdom............... 25881/73

[52] U.S. Cl............... 307/296; 307/310; 330/38 M; 330/40

[51] Int. Cl.$^2$ ........................................... H03K 1/02

[58] Field of Search........... 307/296, 297, 264, 303, 307/310; 330/22, 23, 38 M, 40

[56] References Cited

UNITED STATES PATENTS

| | | | |
|---|---|---|---|
| 3,364,434 | 1/1968 | Widlar | 330/22 |
| 3,392,342 | 7/1968 | Ordower | 330/22 |
| 3,564,438 | 2/1971 | Limberg | 330/38 M |

*Primary Examiner*—John Zazworsky
*Attorney, Agent, or Firm*—H. Christoffersen; S. Cohen; A. L. Limberg

[57] ABSTRACT

An input current is applied to a ladder network comprising diode-connected-transistor shunt legs and resistive series arms. The network derives from the input current a bias current having an amplitude which is a fraction of the input current and supplies that bias current to the base-emitter junction of an amplifier transistor.

16 Claims, 6 Drawing Figures

BIASING CURRENT ATTENUATOR

The present invention relates to circuitry for attenuating biasing current prior to its application to the base-emitter junction of a transistor in an integrated circuit to facilitate obtaining reduced quiescent collector current therein.

It is known in the prior art to apply bias current to the collector-to-emitter path of a diode-connected junction transistor (i.e. a transistor having its base electrode connected to its collector electrode) to develop a potential thereacross which potential is then applied to bias the base-emitter junction of a common-emitter transistor. In such a circuit, the quiescent collector current of the output transistor is proportioned to the bias current as the ratio of the effective area of its base-emitter junction to that of the diode-connected transistor, providing (1) the transistors have similar diffusion profiles and (2) their base-emitter junctions are parallelly connected without intervening elements.

It is also known in the prior art to introduce an emitter degeneration resistor into the common-emitter configuration to reduce the quiescent collector current of the transistor therein with respect to the bias current.

The present invention is comprised in the combination of means for supplying a bias current, a certain type of ladder network which has an input circuit to receive the bias current and has an output circuit, and a common-emitter transistor having its base-emitter circuit connected to the output circuit of the ladder network. The ladder network is distinguished by having diode-connected transistors in each of its shunt legs and a resistive element in each of its series arms.

Figure 1:
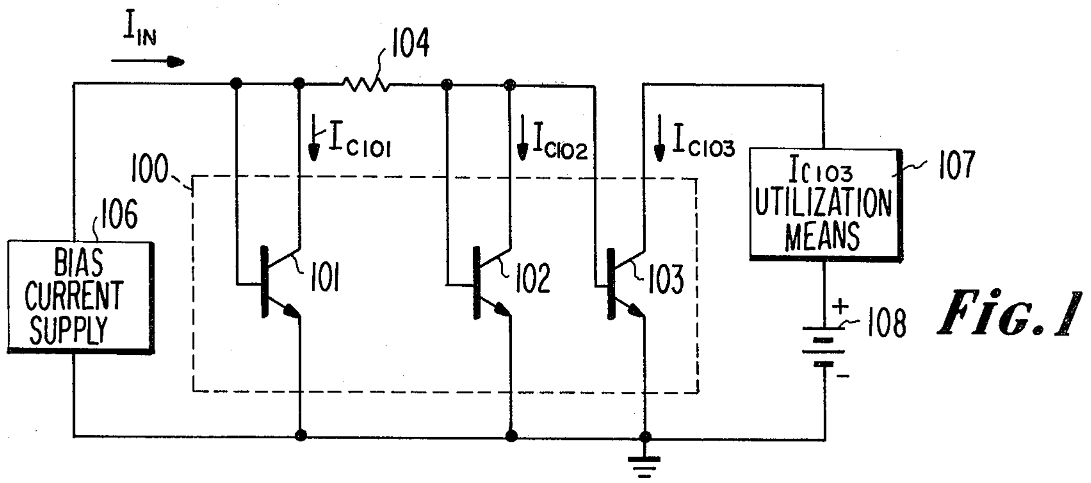
FIG. 1 is a schematic diagram of a biasing arrangement embodying the present invention, wherein the ladder network is a simple pi network.

In the circuit of FIG. 1, an integrated circuit 100 has transistors 101, 102 and 103 therein. Transistors 101, 102 and 103 have similar diffusion profiles and exhibit a close degree of thermal coupling. Transistors 101, 102 are diode-connected-that is, their base electrodes are direct coupled to their respective collector electrodes. A resistive element 104 is connected between the diode-connected transistors 101, 102 to form a pi-network 105, having an input circuit to which means 106 for supplying a bias current is connected and having an output circuit to which the base-emitter circuit of transistor 103 is connected. The collector-emitter circuit of transistor 103 includes means 107 for utilizing the quiescent current flowing therethrough and means 108 for applying reverse-bias to the collector-base junction of transistor 103.

The base-emitter offset potential, $V_{BE}$, of a transistor is known to be a logarithmic function of its collector current, $I_C$. The relationship between these parameters is known to conform to the following equation:

$$V_{BE} = \frac{kT}{q}\ln\frac{I_C}{I_S} \quad (1)$$

where $k$ is Boltzmann's constant,

T is absolute temperature, $q$ is the charge on an electron, and $I_S$ is the saturation current of the transistor.

Now, in the circuit of FIG. 1, $V_{BE101} = I_{C102} R_{104} + V_{BE102}$, (2)
where $R_{104}$ is the resistance of resistive element 104 and $I_{C102}$ is the current flowing through the resistor (and is substantially equal to the current flowing into the collector of transistor 102). The subscripts 101, 102 and 103 denote parameters associated with transistors 101, 102 and 103, respectively, throughout this specification.

The base currents of transistors 101 and 102 are presumed to be negligibly small compared to their respective collector currents, which is a valid presumption for well-designed transistors. Rearranging equation 2, one obtains:

$$R_{104} = \frac{(V_{BE101} - V_{BE102})}{I_{C102}} \quad (3)$$

and substituting equation 1 into equation 2, one obtains $$R_{104} = \left(\frac{1}{I_{C102}}\right)\left(\frac{kT}{q}\right)\left(\ln\frac{I_{C101}}{I_{S101}} - \ln\frac{I_{C102}}{I_{S102}}\right) \quad (4)$$

For transistors 101 and 102 on the same integrated circuit and having the same diffusion profile: $I_{S101} = mI_{S102}$ (5)
where $m$ is the ratio of the effective base-emitter junction area of transistor 101 to that of transistor 102. Combining equations 4 and 5, one obtains:

$$R_{104} = \frac{1}{I_{C102}}\,\frac{kT}{q}\ln\frac{mI_{C101}}{I_{C102}} \quad (6)$$

The same $V_{BE}$ potential is applied to transistors 102 and 103 in the FIG. 1 circuit. Consequently, $$\frac{kT}{q}\ln\frac{I_{C102}}{I_{S102}} = V_{BE102} = V_{BE103} = \frac{kT}{q}\ln\frac{I_{C103}}{I_{S103}} \quad (7)$$

and $$I_{C102} = I_{C103}\frac{I_{S102}}{I_{S103}} \quad (8)$$

For transistors 102 and 103 on the same integrated circuit and having the same diffusion profile: $I_{S102} = nI_{S103}$, (9)
where $n$ is the ratio of the effective area of the base-emitter junction of transistor 102 to that of transistoı 103. Therefore: $I_{C102} = nI_{C103}$. (10)
Substituting equation 10 into equation 6, one obtains:

$$R_{104} = \frac{1}{nI_{C103}} \frac{kT}{q} \ln \frac{mI_{C101}}{nI_{C103}}. \quad (11)$$

In most circuits $I_{C101}$ will exceed $I_{C102}$ by a substantial factor, so the bias current $I_{IN}$ will substantially equal $I_{C101}$. In such case, to good approximation:

$$R_{104} = \frac{1}{nI_{C103}} \frac{kT}{q} \ln \frac{mI_{IN}}{nI_{C103}}. \quad (12)$$

The values of $m$ and $n$ are known (see equations 5 and 9) and the desired values of $I_{IN}$ and $I_{C103}$ are also known. Therefore, the appropriate value of $R_{104}$ can be calculated from equation 11.

When $R_{104}$ is included within the integrated circuit 100, it is desirable to keep its resistance about 1 kilohm to facilitate its fabrication by the same diffusion process used to form the base regions of transistors 101, 102 and 103. It is desirable to make transistors 101 and 103 with as small base-emitter junction areas as possible and to make transistor 102 with a larger base-emitter junction area. This makes $n$ large and makes $m$ smaller. This permits the area required on an integrated circuit die to achieve a certain ratio of output to input current ($I_{C103}/I_{IN}$) to be smaller than that required with prior art circuits.

Figure 2:
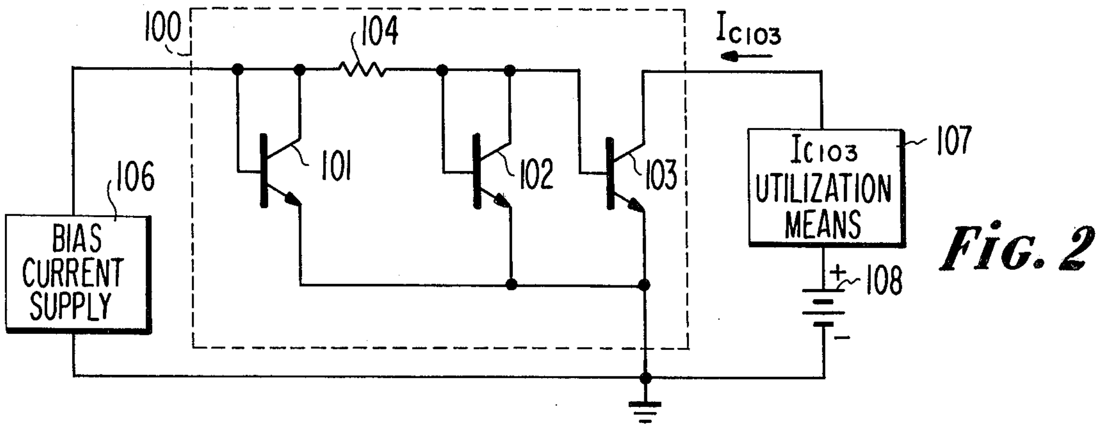
FIG. 2 is a schematic diagram of an embodiment of the present invention, similar to that shown in FIG. 1 but in which the resistive elements in the pi network are integrated together with the transistors of the circuit.

From equation 12 it can be seen that if an increase in temperature T, by a given percentage causes the same percentage of increase in the resistance of $R_{104}$, the ratio of $I_{IN}$ to $I_{C103}$ can be maintained constant for a given value of $I_{IN}$. The temperature encountered within an integrated circuit typically is around 350°K, for which temperature $R_{104}$ would want to increase about 0.285% per degree Kelvin. This temperature coefficient is close to that of diffused resistors formed together with the base diffusion of transistors on an integrated circuit die (which is about 0.275% per degree Kelvin, on average). The inclusion of resistor 104 within the integrated circuit 100 as shown in FIG. 2 provides a configuration where the ratio of $I_{IN}$ to $I_{C103}$ is maintained even more closely constant, with temperature change.

Figure 3:
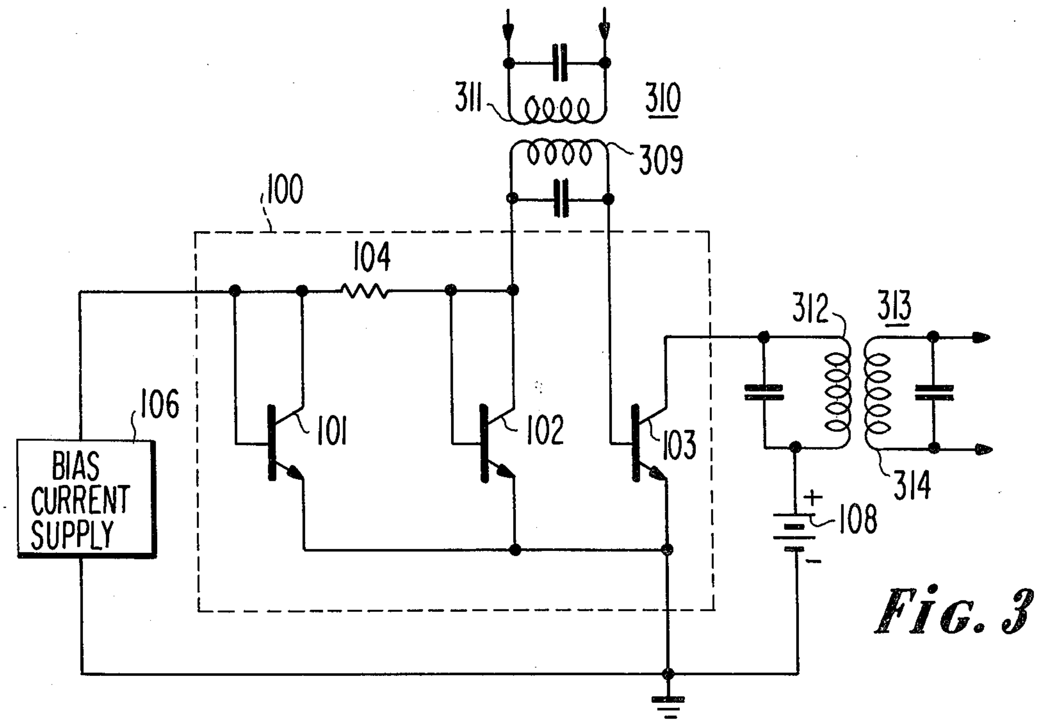
FIG. 3 is a schematic diagram showing a tuned-input, tuned-output amplifier stage biased in accordance with the present invention.

FIG. 3 shows how the present invention can be used to bias a grounded-emitter amplifier stage for low quiescent collector current. The amplifier transistor 103, while its quiescent collector current is low, has no emitter degeneration resistance to interfere with obtaining the highest common-emitter forward current gain available at that quiescent collector current level. The secondary winding 309 of an interstage coupling transformer 310 provides a low-impedance direct current connection between the collector electrode of transistor 102 and the base electrode of transistor 103, so the direct current biasing of the base-emitter junction of transistor 103 is no different from that of the FIG. 2 circuit.

Input signal applied to primary winding 311 of transformer 310 is coupled to its secondary winding 309 for application to the base-emitter junction of transistor 103. The collector current of transistor 103 flows through the primary winding 312 of an interstage transformer 313, the signal component of the current inducing an output signal potential across the secondary winding 314 of the transformer 313. Alternatively, any known input signal coupling method in which a winding 309 is utilized can be used in this circuit.

Figure 4:
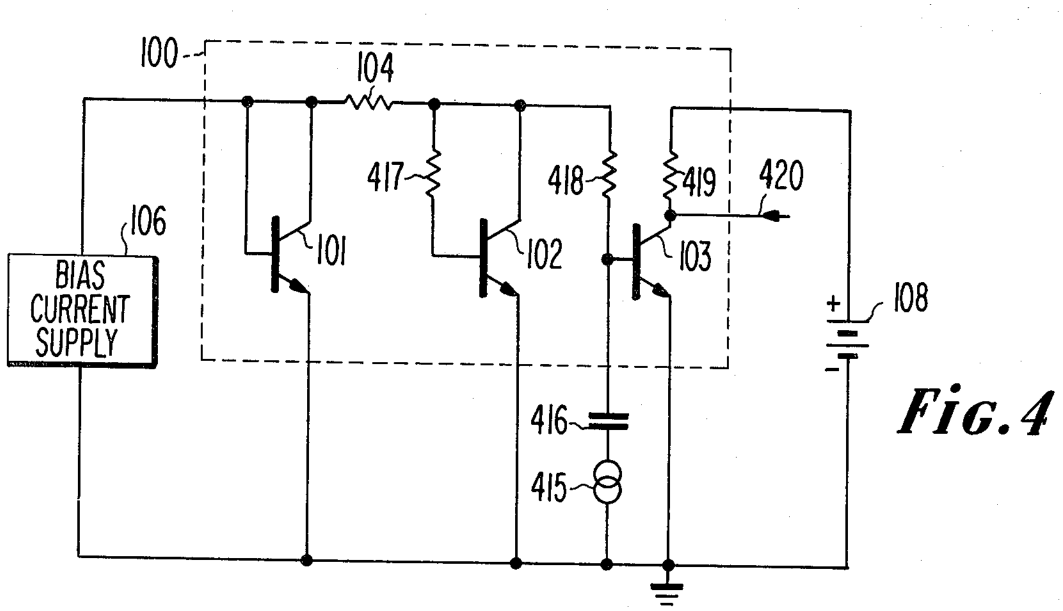
FIG. 4 is a schematic diagram of a resistance-coupled amplifier biased in accordance with the present invention.

FIG. 4 shows how the present invention can be used to bias a resistance-coupled grounded-emitter amplifier stage. Source 415 applies an input signal potential via capacitor 416 to the base-emitter circuit of transistor 103 for amplification.

The base currents of transistors 102 and 103 flow through resistors 417 and 418 respectively, to cause potential drops $V_{417}$ and $V_{418}$, respectively. These potential drops tend to be only a few millivolts for the resistance values of a few kilohms encountered within an integrated circuit. However, since the collector current of a transistor varies exponentially with its base-emitter potential, the effects of the potential drops $V_{417}$ and $V_{418}$ must be taken into account.

By making the resistance of resistors 417 and 418 in the ratio $n$, the potential drops $V_{417}$ and $V_{418}$ will be made equal. The collector-to-base feedback of transistor 102, provided by resistor 104 and 417, stabilizes the operating point of its collector electrode. The few millivolts of potential drop $V_{417}$ across resistor 417 does not reduce the potential drop across resistive element 104 by much, so $I_{C102}$ flow therethrough is not appreciably reduced. The similarity of potentials $V_{417}$ and $V_{418}$ assures that $V_{BE103}$ still equals $V_{BE102}$. since $V_{BE102}$ is determined to maintain $I_{C102}$ at its desired value, $V_{BE103}$ maintains $I_{C103}$ at its desired value.

The quiescent collector current flow requirement of transistor 103 is provided via resistor 419 from operating potential supply 108. The variations in the collector current of transistor 103 provided in response to input signal from signal source 415 develop an output signal potential across resistor 419, which output signal potential can be coupled via connection 420 to subsequent amplifier stages.

Figure 5:
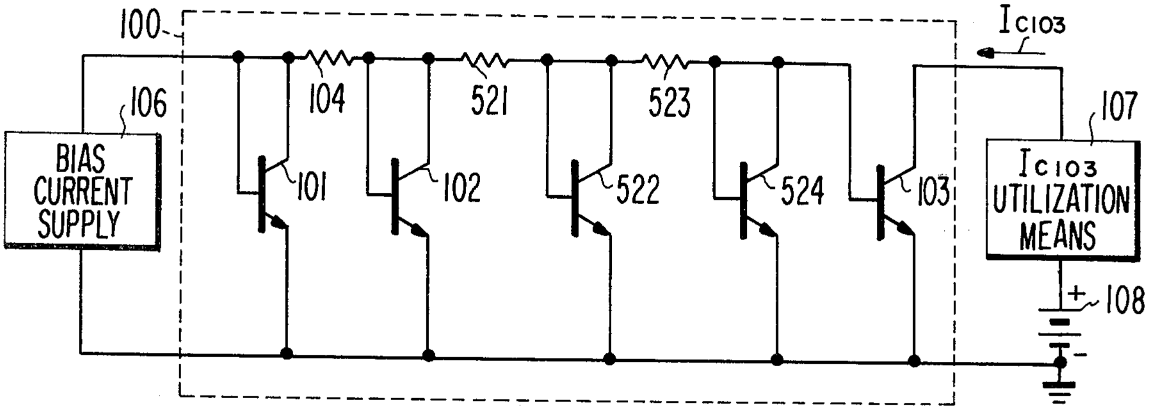
FIGS. 5 and 6 are schematic diagrams of circuits employing the present invention, in which the ladder network comprises one or more L sections in addition to the pi network.

FIG. 5 illustrates an embodiment of the present invention in which the ladder network of resistors and diode-connected transistors includes the simple pi network of elements 101, 104, 102 followed by additional L sections. The first of these additional L sections comprises resistor 521 and diode-connected transistor 522; the second, resistor 523 and diode-connected transistor 524. The L section formed from elements 521 and 522 receives less current than the diode-connected transistor 102, in a manner analogous to the lower current flow in elements 104 and 102 than in diode-connected transistor 101. Similarly, the L section formed from elements 523 and 524 receives less current than diode-connected transistor 522.

The $V_{BE}$ potential developed between the base (or collector) and emitter electrodes of transistor 524 is representative of a current level reduced in three successive steps with respect to that supplied to diode-connected transistor 101 from bias current supply 106. This $V_{BE}$ applied to the base-emitter junction of transistor 103 provides for greatly decreased quiescent collector current flow therethrough.

Assume the transistors 101, 102, 522, 524 and 103 to be substantially identical in geometry. Distributing the combined resistance of resistors 104, 521 and 528 between the diode-connected transistors 101, 102, 522 and 524 will result in a lower quiescent collector current into transistor 103 than for the case where (1) the same resistors are serially connected without intervening connections to other elements and (2) the diode-connected transistors 102 and 522 are connected in parallel with diode-connected transistor 524.

Optimum relative resistances for the resistors in the ladder network to achieve maximum attenuation of the collector current of transistor 103 may be determined by iteratively using the mathematical techniques discussed in connection with FIG. 1. Since the equations are non-linear, it is difficult to use analytical methods to solve them for optimum resistance values. The more practical solution is to use computer to solve the equations for many values of the resistors in the ladder network, and then to select from these many solutions the optimal solutions.

However, making the resistances of the resistors substantially equal approaches the optimum solution when the diode-connected transistors are alike. That is, generally speaking, distribution of the elements in the bias current attenuation network rather than lumping thereof results in maximum attenuation. Also, generally speaking, one can achieve attenuation networks even more economical of integrated circuit area for cases where the resistors are integrated together with the transistors by making the diode-connected transistors have progressively larger base-emitter areas in the latter sections of the attenuator network.

Figure 6:
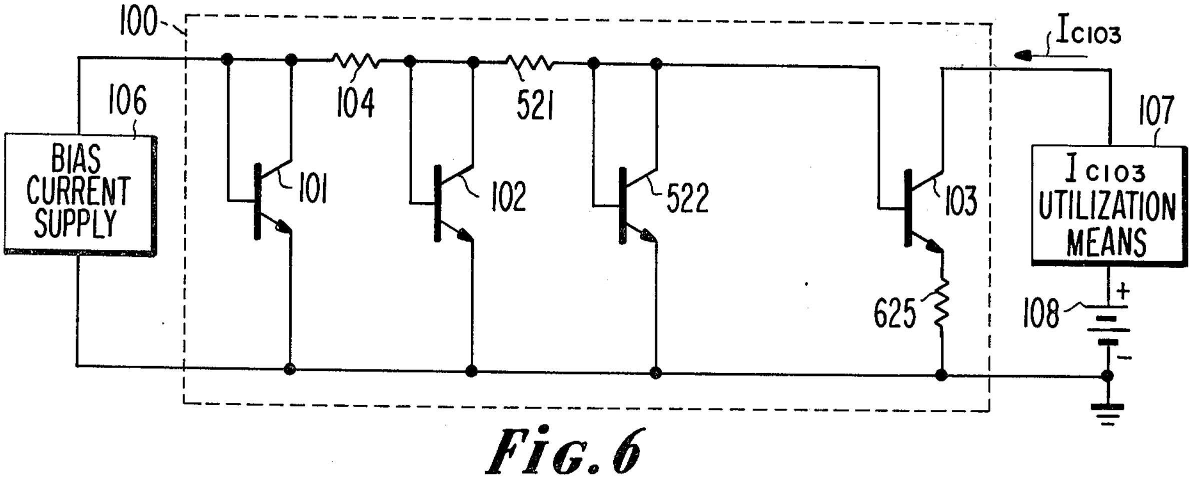

FIG. 6 illustrates an embodiment of the presnet invention which in addition to the technique discussed above, also utilizes the prior-art scheme of inserting an emitter resistance in series with the base-emitter junction of the output transistor 103, to aid in the attenuation of its collector current.

While the ratio of $I_{IN}$ to $I_{C103}$ in circuits embodying the present invention can be made substantially invariant with temperature as discussed in connection with FIG. 2, $I_{C103}$ does not vary proportionally with $I_{IN}$ variation. It can be shown that $I_{C103}$ varies logarithmically with $I_{IN}$ in the FIGS. 1–4 configurations. Generally, $I_{C103}$ varies as $\ln^n I_{IN}$, where $n$ is the number of L sections in the ladder network and transistor 103 has no emitter degeneration resistance ($I_{C103}$ is porportional to $\ln^3 I_{IN}$ in the FIG. 5 case, for instance). Generally, $I_{C103}$ varies as $\ln^{n+1} I_{IN}$ when transistor 103 has substantial emitter resistance ($I_{C103}$ is proportional to $\ln^3 I_{IN}$ in the FIG. 6 case, for instance). Resistor 625 is considered to have substantial resistance if large enough that there is at least a few tens of millivolts potential drop thereacross. Therefore, an extended ladder network can be used to make $I_{C103}$ substantially independent of $I_{IN}$.

What is claimed is:

1. In a biasing arrangement including first and second transistors within an integrated circuit, each of said first and said second transistors having base and emitter electrodes with a base-emitter junction therebetween and having a collector electrode; a first terminal for receiving a reference potential; a second terminal for receiving an operating potential; means for direct current conductively coupling the emitter electrodes of said first and said second transistors to said first terminal; current utilization means connecting the collector electrode of said first transistor to said second terminal; and a node of said integrated circuit direct current coupled to the collector and base electrodes of said second transistor, said node for receiving a bias current; an improved circuit for coupling a portion of said bias current from said node to said first transistor base electrode comprising:

at least one ladder network section having a series arm and a shunt leg, said series arm thereof having a first and a second end which are respectively coupled to said node and the base electrode of said first transistor, said shunt leg thereof having a first and a second ends which are respectively connected to said second end of said series arm and to said first terminal;

a resistive element included in the series arm of each ladder network section;

a semiconductor diode device included in the shunt leg of each ladder network section and within said integrated circuit and poled to be forward biased by the passage of a portion of said bias current therethrough, wherein said semiconductor diode device included in said shunt leg comprises a further transistor having an emitter electrode and a collector electrode connected to separate ones of the first and second ends of said shunt leg, having a base electrode direct coupled to its collector electrode and having a base-emitter junction between its said base and said emitter electrodes; and first and second further resistive elements connecting the base electrodes of said first transistor and of said further transistor in the preceding said ladder network section, respectively, to the collector electrode of the latter.

2. The improvement of claim 1 having:

means for providing a signal referred to said reference potential to be amplified by said first transistor and a capacitor connecting said signal providing means to said first transistor base electrode.

3. The improvement set forth in claim 1 wherein:

the ratio of the resistances of said first and said second further resistive elements is inversely proportional to the ratio of the effective base-emitter junction areas of said first transistor and of said further transistor in said preceding ladder network section, and said first transistor emitter electrode is direct current conductively coupled to said first terminal of said potential supplying means.

4. In combination:

a first terminal for application of a reference potential;

a second terminal for application of an operating potential;

a third terminal;

means for supplying a bias current to said third terminal;

first and second transistors, each having base and emitter electrodes with a base-emitter junction therebetween and having a collector electrode, the emitter electrode of said first transistor being directly connected without substantial intervening impedance to said first terminal; and the collector electrode of said first transistor being galvanically coupled to said third terminal;

means galvanically coupling the collector electrode of said second transistor to said second terminal, which means includes means for utilizing the collector current of said second transistor;

means direct coupling said third terminal to the base electrode of said first transistor for maintaining a base potential thereat to condition said first transistor for a collector current flow substantially equal to but somewhat smaller than said bias current;

conductive means connecting the electrode at one end of the base-emitter junction of said second transistor to said first terminal; and means for applying a portion of the base potential of said first transistor to the other end of the base-emitter junction of said second transistor comprising:

N sections of a ladder network, each section comprising a series arm and a shunt leg, each said series arm being connected in a path between said node and said other electrode, and the shunt leg of each section being connected between the output end of the series arm of that section and said point of reference potential, each series arm comprising a resistive element and each shunt arm comprising a diode connected to conduct the current it receives from its series arm, in the forward direction, where N in an integer equal to at least one.

5. In the combination as set forth in claim 4, further including a winding connected between the last of said series arms and said other electrode serving as a low impedance connection and as an input signal receiving means.

6. In the combination as set forth in claim 4, said ladder network and said first and second transistors comprising a circuit integrated onto a common substrate.

7. In the combination set forth in claim 4, said conductive means consisting of a direct connection without substantial intervening impedance.

8. In the combination set forth in claim 4, said conductive means comprising a further resistive element.

9. In combination:

first, second and third terminals;

means for supplying an operating potential between said first and second terminals;

means for maintaining a bias current flow between said first and third terminals;

first and second transistors, each having base and emitter electrodes with a base-emitter junction therebetween and having a collector electrode;

a direct connection without substantial intervening impedance of the emitter electrode of said first transistor to said first terminal;

first conductive means galvanically coupling the emitter electrode of said second transistor to said first terminal;

second conductive means galvanically coupling said first transistor collector electrode to said third terminal;

third conductive means galvanically coupling said second transistor collector electrode to said second terminal; including means for utilizing the collector current flow of said second transistor;

a degenerative feedback connection of the collector electrode of said first transistor to its base electrode, for applying a base-emitter potential to said first transistor to condition it for a collector current flow substantially equal to but somewhat smaller than said bias current flow;

a first resistive element having first and second ends, said first end being galvanically coupled to the base electrode of said second transistor;

a semiconductor diode device connected between the first end of said resistive element and said first terminal and poled for simultaneous easy conduction with the base-emitter junction of said second transistor; and means for applying the base-emitter potential of said first transistor between the second end of said resistive element and the emitter electrode of said second transistor.

10. The combination set forth in claim 9 including:

a transformer having a primary winding for receiving an input signal and having a secondary winding connected between the first end of said resistive element and the base electrode of said second transistor.

11. The combination set forth in claim 9, wherein said semiconductor diode device comprises a third transistor having emitter and collector electrodes serving as separate ones of the anode and cathode of the semiconductor diode device and having a base electrode to which its collector electrode is direct coupled.

12. The combination set forth in claim 9, wherein said first conductive means consists of a direct connection without substantial intervening impedance.

13. The combination set forth in claim 9 wherein said first conductive means comprises a second resistive element.

14. In combination:

a first semiconductor diode means receptive of a forward bias current to develop an offset potential thereacross;

an output transistor having base and emitter electrodes with a base-emitter junction therebetween and having a collector electrode;

means for completing the collector-to-emitter circuit of said output transistor;

a second semiconductor diode means in parallel connection with the base-emitter junction of said output transistor;

a resistance in series connection with said parallel connection;

means applying the offset potential across said first semiconductor diode means, applying it across said series connection in a poling to cause forward bias current flow through said second semiconductor diode means and base current flow in said output transistor, wherein, because of the potential drop in said resistance due to the combined flow therethrough of said output transistor base current and the forward bias current which flows through said second semiconductor diode means, the offset potential across said second semiconductor diode means is caused to be smaller than the offset potential across said first semiconductor diode means.

15. In the combination of claim 14 at least one of said semiconductor diode means comprising a diode-connected transistor.

16. In combination:

a first diode means comprising a semiconductor junction;

means supplying a current in the forward direction to said first diode means for developing an offset potential thereacross;

means for developing a bias voltage which is a portion of said offset potential, comprising a potential divider having input terminals connected across said first diode means and responsive to said offset voltage, said potential divider comprising resistive means in series with second diode means between said input terminals, said second diode means being poled in the forward direction with respect to said offset potential; and a bipolar transistor having a base-emitter junction, said junction connected in the forward direction across said second diode means.

* * * * *